(12) United States Patent
Shirota

(10) Patent No.: US 6,274,934 B1
(45) Date of Patent: Aug. 14, 2001

(54) SEMICONDUCTOR DEVICE AND METHOD OF MANUFACTURING THEREOF

(75) Inventor: Hiroshi Shirota, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/488,778

(22) Filed: Jan. 21, 2000

(30) Foreign Application Priority Data

Jul. 26, 1999 (JP) .................................................. 11-210778

(51) Int. Cl.[7] ........................ H01L 23/48; H01L 21/4763
(52) U.S. Cl. ........................ 257/758; 257/773; 438/14; 438/599; 438/622
(58) Field of Search ........................... 257/529, 750, 257/758, 773, 776; 438/14, 618, 622, 598, 599

(56) References Cited

U.S. PATENT DOCUMENTS

| | | | |
|---|---|---|---|
| 4,648,075 | * | 3/1987 | Segawa et al. ........................ 365/200 |
| 5,241,212 | * | 8/1993 | Motonami et al. ................... 257/529 |
| 5,723,908 | * | 3/1998 | Fuchida et al. ....................... 257/758 |
| 5,773,855 | * | 6/1998 | Colwell et al. ....................... 257/206 |
| 5,998,846 | * | 12/1999 | Jan et al. ............................... 257/401 |

FOREIGN PATENT DOCUMENTS

| | | | |
|---|---|---|---|
| 2130770 | * | 6/1984 | (GB) ............................... G11C/5/00 |
| 57-190343 | | 11/1982 | (JP) ............................... H01L/27/04 |
| 2-264455 | | 10/1990 | (JP) ............................... H01L/21/82 |
| 5-47933 | | 2/1993 | (JP) ............................... H01L/21/82 |

* cited by examiner

Primary Examiner—T. N. Quach
(74) Attorney, Agent, or Firm—McDermott, Will & Emery

(57) ABSTRACT

A semiconductor device and a method of manufacturing thereof are provided so as to make a spare electronic circuit available without changing arrangement of normal electronic circuit interconnections under a design rule. In order to achieve this, second metal interconnections as spare electronic circuit interconnections are preliminary formed in a region where the spare inverter circuit is formed.

8 Claims, 15 Drawing Sheets

SEMICONDUCTOR DEVICE AND METHOD OF MANUFACTURING THEREOF

BACKGROUND OF THE INVENTION

1. Field of the Invention

The present invention relates to a semiconductor device having in addition to a normal electronic circuit a spare electronic circuit which is used in the event of failure of the normal electronic circuit and used when the logic design is changed, and relates to a method of manufacturing such a semiconductor device.

2. Description of the Background Art

A semiconductor device provided with a spare electronic circuit has conventionally been used. When any failure of a normal electronic circuit or any mistake in a logic design of the entire semiconductor device is discovered by inspection, the spare electronic circuit is substituted for the failed normal electronic circuit or added between normal electronic circuits by just changing metal interconnections, only the spare electronic circuit then connected to other normal electronic circuits, so as to improve the yield of the semiconductor device.

A conventionally used semiconductor device having a spare electronic circuit in addition to a normal electronic circuit is hereinafter described in conjunction with FIGS. 13 to 15. The conventional semiconductor device having a spare electronic circuit has, for example, an inverter circuit 108a and an NAND circuit 109a at a semiconductor substrate 101 as normal electronic circuits as shown in FIGS. 13 and 14. Between inverter circuit 108a and NAND circuit 109a at semiconductor substrate 101, an inverter circuit 108b is provided as a spare which is used as a spare electronic circuit for inverter circuit 108a or used for changing the logic design of the entire electronic circuit.

Circuit element formation regions 101a and 101b are formed at inverter circuit 108a. Contact plugs 103 are connected to the source/drain regions of element formation regions 101a and 101b. A gate electrode 102a is provided to element formation regions 101a and 101b to be located between the source/drain regions.

Circuit element formation regions 101c and 101f are formed at spare inverter circuit 108b. Contact plugs 103 are connected to the source/drain regions of element formation regions 101c and 101f. A Gate electrode 102b is provided to element formation regions 101c and 101f to be located between the source/drain regions.

Circuit element formation regions 101d and 101e are formed at NAND circuit 109a. Contact plugs 103 are connected to the source/drain regions of element formation regions 101d and 101e. Gate electrodes 102c and 102d are formed at element formation regions 101d and 101e to be located between the source/drain regions.

Contact plugs 104a, 104b, 104c and 104d are respectively provided at gate electrodes 102a, 102b, 102c and 102d for connecting gate electrodes 102a, 102b, 102c and 102d with first metal interconnections located in an upper layer. At the upper ends of contact plugs 104a, 104b, 104c and 104d, first metal interconnections 105a, 105b, 105c and 105d are formed that extend laterally in FIG. 13 at a substantially constant height from a main surface of the semiconductor substrate. Outside the region where inverter circuit 108a, spare inverter circuit 108b and NAND circuit 109a are formed, a first metal interconnection 105e is formed which laterally extends in FIG. 13 to connect inverter circuit 108a with NAND circuit 109a.

Second metal interconnections 107a, 107b, 107c, 107d, 107e, 107f, 107g, 107h and 107i are formed in a layer which is located at a greater height from the substrate than the layer where the first metal interconnections 105a, 105b, 105c and 105d are formed. Plugs 106a, 106d, 106e, 106f, 106g, 106h and 106i are formed in order to connect the first metal interconnections 105a, 105b, 105c and 105d with the second metal interconnections 107a, 107b, 107c, 107d, 107e, 107f, 107g, 107h and 107i. These first metal interconnections, plugs and second metal interconnections are formed in an insulating film 200.

In this conventional semiconductor device thus provided with spare inverter circuit 108b, if inverter circuit 108a as a normal electronic circuit fails or when logic design is corrected by adding spare inverter circuit 108b, spare inverter circuit 108b can be utilized. When spare inverter circuit 108b is employed, limited layers such as the first metal interconnections, the plugs and the second metal interconnections are changed so as to replace inverter circuit 108a with spare inverter circuit 108b or to add spare inverter circuit 108b between inverter circuit 108a and NAND circuit 109a, and accordingly repair or change in the electronic circuit structure of the semiconductor device is accomplished. This scheme is employed in order to reduce the manufacturing cost of the semiconductor device as well as the turn-around-time in the manufacturing process of the semiconductor device.

In the above-described conventional semiconductor device having the spare electronic circuit, the second metal interconnections 107a and 107b which are normal electronic circuit interconnections connected to normal electronic circuits pass through the region where spare inverter 108b is formed. Therefore, if any defect in the circuit design is detected by inspection, change in arrangement of the interconnections is inevitable as shown in FIG. 15 in which the second metal interconnections 107a and 107b, which pass through the region where spare inverter circuit 108b is formed and connect normal circuits with each other, are moved to another region so as to use spare inverter circuit 108b. Specifically, the second metal interconnection 107a is changed to second metal interconnections 107m, 107k, 107p and first metal interconnections 105k and 105m, and the second metal interconnection 107b is changed to second metal interconnections 107n, 107o and 107l and first metal interconnections 105l and 105n. As a result, the interconnection route is extended by the lengths of the first metal interconnections 105l, 105n, 105k and 105m. If the route made up of the first metal interconnections 105l, 105n, 105k and 105m is extremely long, there arises a remarkable difference between the lengths of the electronic circuit interconnections connecting the electronic circuits with each other respectively before the change in the interconnections and after that. This difference of the lengths causes a delay in a pulse which travels between electronic circuits. The delay in the pulse between normal electronic circuits then causes lag of response timing between one electronic circuit and another electronic circuit. Accordingly, if any change is made in the interconnections which is accompanied by change in the arrangement of electronic circuit interconnections established in the original design, the change in the interconnections could adversely influence the entire electronic circuit.

Further, if the required change in interconnections is accompanied by a remarkable change in normal electronic circuit interconnection routes, the normal electronic circuit interconnection routes could be located too close to each other as in the region near the second metal interconnections 107p and 107o. If the electronic circuit interconnections are extremely close to each other, they could exert adverse electrical effects on each other. Therefore, change in the interconnections which could cause closely located electronic circuit interconnection routes should be avoided. Consequently, it is impossible to easily find out changed interconnection routes which do not introduce the closely located electronic circuit interconnection routes, and thus a spare electronic circuit cannot be utilized easily.

According to the metal interconnection design of the current semiconductor integrated circuit, in the same layer, electronic circuit interconnections each having a substantially minimum width under a design rule are arranged with a substantially minimum space therebetween under the design rule. Because of this, in the stage of design to change the interconnections, there could be no space in the same layer, between existing metal interconnections which have already been fixed, where a metal interconnection is to be inserted which is newly provided after the change in the interconnections.

If there is no space for inserting electronic circuit interconnections in the same layer, the arrangement of a large number of normal electronic circuit interconnections should be changed. If a large number of normal electronic circuit interconnections are changed, change in interconnections in just one or two layers is not enough, and thus change in interconnections in many layers is required. Consequently, if a spare electronic circuit is used, a large number of spare masks where patterns after change in interconnections are formed could be necessary.

SUMMARY OF THE INVENTION

One object of the present invention is to provide a semiconductor device and a method of manufacturing thereof which enable under a design rule use of a spare electronic circuit without change in interconnections which is accompanied by change in arrangement of normal electronic circuit interconnections.

A semiconductor device according to the present invention includes a plurality of normal electronic circuits formed at a main surface of a semiconductor substrate, a spare electronic circuit formed at the main surface of the semiconductor substrate, and a normal electronic circuit interconnection for electrically connecting the normal electronic circuits with each other, the normal electronic circuit interconnection including normal conductive layers located above the main surface of the semiconductor substrate to respectively extend substantially in parallel with a plurality of layers which are substantially in parallel with the main surface, and the normal conductive layers being formed to have a substantially minimum limit width under an applied design rule. The space between the normal conductive layers is defined under the design rule so as not to allow another conductive layer to newly be formed in almost all regions except for a predetermined region. A spare path for an electronic circuit interconnection is provided so as to form an electronic circuit interconnection which connects the spare electronic circuit with the normal electronic circuit interconnection without making a change in interconnection which is accompanied by change in arrangement of the normal electronic circuit interconnection under the design rule if change in interconnection becomes necessary in the predetermined region in order to use the spare electronic circuit.

Owing to such a structure, when the spare electronic circuit is used, a region where a spare electronic circuit interconnection can be formed is ensured without change in the normal electronic circuit interconnection under the design rule. Therefore, if change in the interconnection becomes necessary for using the spare electronic circuit, change in arrangement of the normal electronic circuit interconnection to move it another region is not required. Specifically, just a change is made in the normal electronic circuit interconnection such as partial removal or partial addition thereof at a portion where the normal electronic circuit interconnection is connected to the spare circuit. After the interconnection is changed so as to connect the spare electronic circuit, there is thus no change in the path of normal electronic circuit interconnection which connects normal electronic circuits with each other. Accordingly, the length of the normal electronic circuit interconnection connecting normal electronic circuits with each other does not change. If change in interconnection is made which is accompanied by change in arrangement of the normal electronic circuit interconnection connecting normal electronic circuits with each other, delay of a pulse which travels between electronic circuits is caused by a significant change in the length of the electronic circuit interconnection. This delay is thus avoided by the structure as described above. As a result, lag of response timing of the electronic circuits due to the delay of pulse travelling between the normal electronic circuits does not occur. Owing to the structure of the semiconductor device of this embodiment, the adverse effect is prevented on the entire electronic circuit caused by change in interconnection which is accompanied by change in arrangement of the normal electronic circuit interconnection.

In the structure of the semiconductor device of the invention, it is unnecessary to drastically change the arrangement of the route of the normal electronic circuit interconnection. After the interconnection is changed, if any electronic circuit interconnection is inserted between normal electronic circuit interconnections, the electronic circuit interconnection routes could be located too close to each other. However, this state is prevented in the structure of the invention. It is thus possible to avoid the situation in which change in the interconnections is impossible because of the closely located electronic circuit interconnection routes. Accordingly, change in interconnection in order to use a spare electronic circuit can be made easily.

Further, it is unnecessary to change arrangement of a number of normal electronic circuit interconnections, so that a spare electronic circuit becomes available with change in interconnections in just one or two layers. Thus, change in interconnections in many layers does not occur. When change in interconnection is required, preparation is unnecessary of a large number of spare masks used for changing interconnections in order to form patterns after the change in interconnection. Consequently, with a small number of spare masks, change in interconnection can be made, so that the process of fabricating electronic circuit interconnections can be shortened and yield of the semiconductor device can be improved with a simple correction in design of the electronic circuit interconnections.

In the semiconductor device of the invention, a spare path for electronic circuit interconnection may be formed only in the vicinity of the region where an electrode terminal of a spare electronic circuit is located.

Such a structure allows, the region where the spare electronic circuit is formed, to be served as a region where a spare electronic circuit interconnection can easily be formed, so that change in interconnection is easily made so as to use the spare electronic circuit and the interconnection space is saved since the spare path for electronic circuit interconnection is placed only in the vicinity of the electrode terminal.

In the semiconductor device of the invention, in the spare path for electronic circuit interconnection in the vicinity of the electrode terminal, a spare electronic circuit interconnection having one end connected to the electrode terminal may be provided.

In such a structure, the spare electronic circuit interconnection is formed in the vicinity of the electrode terminal of the spare electronic circuit, so that just a change or addition is made partially in the electronic circuit interconnection in order to make a correction in changing interconnection. Accordingly, interconnection of a spare mask can easily be designed. Since the spare electronic circuit interconnection is formed only in the vicinity of the region where the electrode terminal of the spare electronic circuit is formed, the spare electronic circuit interconnection does not interrupt the route of normal electronic circuit interconnection. Further, since the spare electronic circuit interconnection is formed, when a spare mask used for changing interconnection is designed, the region where the spare electronic circuit is formed can be made apparent. Therefore, mistake in design is avoided in changing interconnection such as erroneous arrangement of electronic circuit interconnection in the region where spare electronic circuit is formed.

In the semiconductor device, the spare path for electronic circuit interconnection may include a portion where a plug is to be formed and a portion where a conductive layer is to be formed. The portion where a plug is to be formed extends substantially perpendicularly to the main surface of the semiconductor substrate and is used for forming a plug when the spare electronic circuit is employed. The portion where a conductive layer is to be formed contacts with an end of the plug formation portion, located in a layer which is substantially in parallel with the main surface of the semiconductor substrate, extending substantially in parallel with normal conductive layers, and used for forming a conductive layer when the spare electronic circuit is employed.

In such a structure, interconnections can be changed just by forming conductive layers formed of straight lines in parallel with each other and forming plugs connected thereto. An interconnection pattern for changing interconnections can easily be designed so as to correct a mistake in logic design of an electronic circuit. If spare plugs and spare conductive layers are formed, a mistake can be avoided in changing interconnections such as erroneous formation of an electronic circuit interconnection in a spare path for electronic circuit interconnection.

In the semiconductor device of the invention, spare conductive layers may be stacked to cross substantially perpendicularly to each other in layers which are adjacent to each other and substantially in parallel with the main surface of the semiconductor substrate.

In such a structure, linearly shaped spare conductive layers can be formed over the entire semiconductor chip from end to end, and accordingly a normal electronic circuit and a spare electronic circuit which are located far from each other can be connected.

There is a high possibility of a spare electronic circuit interconnection passing in the vicinity of a spare electronic circuit, and thus spare electronic circuits dispersed over the entire semiconductor chip can be used. Thus, spare electronic circuit interconnections can easily be dispersed.

Further, since the spare conductive layer is linearly shaped as a normal conductive layer, there is a low possibility of interruption of the normal conductive layer by the spare conductive layer.

In the semiconductor device of the invention, spare conductive layers may be formed as seemed to be combined ladders with offset rungs in plan view in adjacent layers which are substantially in parallel with the main surface of the semiconductor substrate.

Owing to such a structure, the number of cut portions is reduced compared with a structure where the conductive layers are formed as a lattice in plan view. Specifically, a relatively simple change in interconnection, for example, just change and cut of interconnections of a mask of one metal interconnection layer are made in order to make a spare electronic circuit available. Further, the spare electronic circuit and the normal electronic circuit can be connected with a relatively short distance relative to three-dimension without using a path like a detour.

A method of manufacturing a semiconductor device according to the invention includes the steps of forming a plurality of normal electronic circuits and at least one spare electronic circuit at a main surface of a semiconductor substrate, forming an insulating film on the semiconductor substrate to cover the normal electronic circuits and the spare electronic circuit, preparing a normal mask having a normal pattern formed for forming a normal electronic circuit interconnection which electrically connects the normal electronic circuits with each other and a spare mask having a spare electronic circuit interconnection pattern formed for using the spare electronic circuit in addition to a pattern substantially identical to the normal pattern, inspecting the normal electronic circuits, selecting, based on result of the inspection, the normal mask or the spare mask to form on the insulating film an electronic circuit interconnection which connects the normal electronic circuits with each other or connects the normal electronic circuits with the spare electronic circuit. The normal pattern is arranged to ensure a spare path for the electronic circuit interconnection where a spare electronic circuit interconnection can be formed without changing arrangement of the pattern of the normal electronic circuit interconnection under an applied design rule.

According to this manufacturing method, when the spare electronic circuit is used, the spare mask is prepared which ensures a region where a spare electronic circuit interconnection can be formed without change in normal electronic circuit interconnection under the design rule. Therefore, when it becomes necessary to change interconnection in order to use the spare electronic circuit, arrangement of normal electronic circuit interconnection need not move to another region. Specifically, the spare mask is formed such that the normal electronic circuit interconnection is partially removed or partially added in the portion at which the normal electronic circuit interconnection is connected with the spare circuit. By using such a spare mask, the situation in which change in interconnection is impossible or interconnections are located too close to each other can be avoided.

In addition, there is no need to make a change in design of the electronic circuit interconnections located in a large number of layers, as accompanied by a significant change in arrangement of normal electronic circuit interconnections. Accordingly, the number of spare masks used for changing interconnection is reduced. The manufacturing process of the semiconductor device is thus shortened and yield of the semiconductor device can easily be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with the drawings.

First Embodiment

A semiconductor device in the first embodiment of the invention is now described in conjunction with FIGS. 1 to 5.

Figure 1:
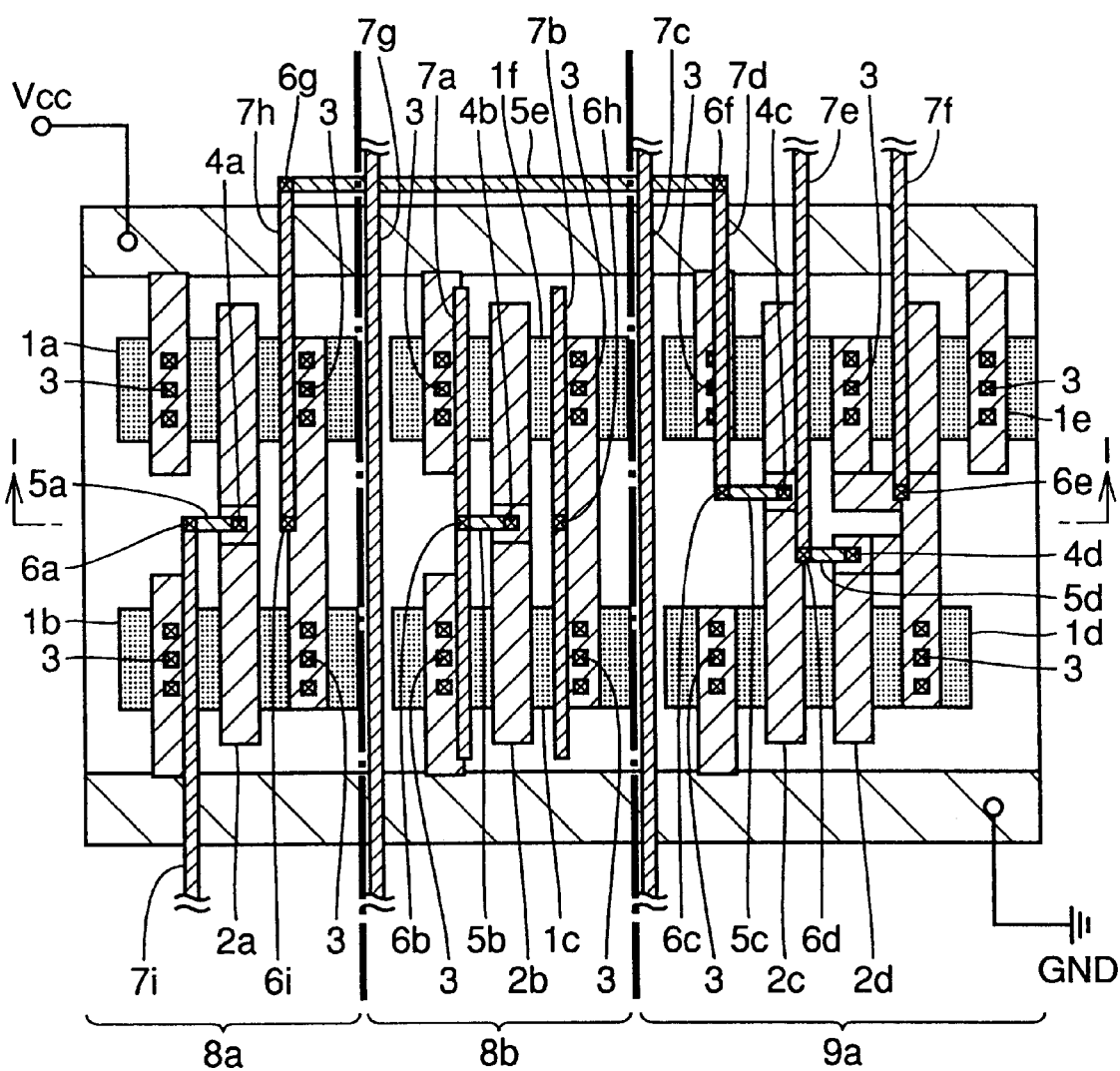
FIG. 1 is a plan view of a structure of a semiconductor device in a first embodiment of the invention in which no spare inverter circuit is used.

Referring to FIG. 1, the semiconductor device having a spare circuit includes a normal inverter circuit 8*a* and an NAND circuit 9*a*. As the spare circuit, a spare inverter circuit 8*b* is placed between inverter circuit 8*a* and NAND circuit 9*a*.

Circuit element formation regions 1*a* and 1*b* are formed at inverter circuit 8*a*. Contact plugs 3 are connected to source/drain regions of element formation regions 1*a* and 1*b*. A gate electrode 2*a* is formed at element formation regions 1*a* and 1*b* to be located between respective source/drain regions.

Circuit element formation regions 1*c* and 1*f* are formed at spare inverter circuit 8*b*. Contact plugs 3 are connected to source/drain regions of element formation regions 1*c* and 1*f*. A gate electrode 2*b* is formed at element formation regions 1*c* and 1*f* to be located between respective source/drain regions.

Circuit element formation regions 1*d* and 1*e* are formed at NAND circuit 9*a*. Contact plugs 3 are connected to source/drain regions of element formation regions 1*d* and 1*e*. Gate electrodes 2*c* and 2*d* are formed at element formation regions 1*d* and 1*e* to be located between source/drain regions.

At upper surfaces of respective gate electrodes 2*a*, 2*b*, 2*c* and 2*d*, contact plugs 4*a*, 4*b*, 4*c* and 4*d* are formed substantially perpendicularly to a semiconductor substrate to connect gate electrodes 2*a*, 2*b*, 2*c* and 2*d* with first metal interconnections. Among them, contact plug 4*b* is a spare electronic circuit interconnection connected to gate electrode 2*b* of spare inverter circuit 8*b*. At contact plugs 4*a*, 4*b*, 4*c* and 4*d*, first metal interconnections 5*a*, 5*b*, 5*c* and 5*d* are formed at a substantially constant height from a main surface of the semiconductor substrate to extend laterally in FIG. 1. Outside the region where inverter circuit 8*a*, spare inverter circuit 8*b* and NAND circuit 9*a* are formed, a first metal interconnection 5*e* is formed extending laterally in FIG. 1 to connect inverter circuit 8*a* with NAND circuit 9*a*.

Further, in order to connect the first metal interconnections 5*a*, 5*b*, 5*c* and 5*d* with any of second metal interconnections formed in a layer at a greater height from semiconductor substrate 1 than that at which the first metal interconnections 5*a*, 5*b*, 5*c* and 5*d* are formed, plugs 6*a*, 6*b*, 6*c*, 6*d*, 6*e*, 6*f*, 6*g*, 6*h* and 6*i* are formed substantially perpendicularly to semiconductor substrate 1. Among them, plugs 6*b* and 6*h* are spare electronic circuit interconnections connected to spare inverter circuit 8*b*. At upper ends of plugs 6*a*, 6*b*, 6*c*, 6*d*, 6*e*, 6*f*, 6*g*, 6*h* and 6*i*, any of the second metal interconnections 7*a*, 7*b*, 7*c*, 7*d*, 7*e*, 7*f*, 7*g*, 7*h* and 7*i* extending longitudinally in FIG. 1 is connected. Among them, the second metal interconnections 7*a* and 7*b* are spare electronic circuit interconnections connected to spare inverter circuit 8*b*.

Figure 2:
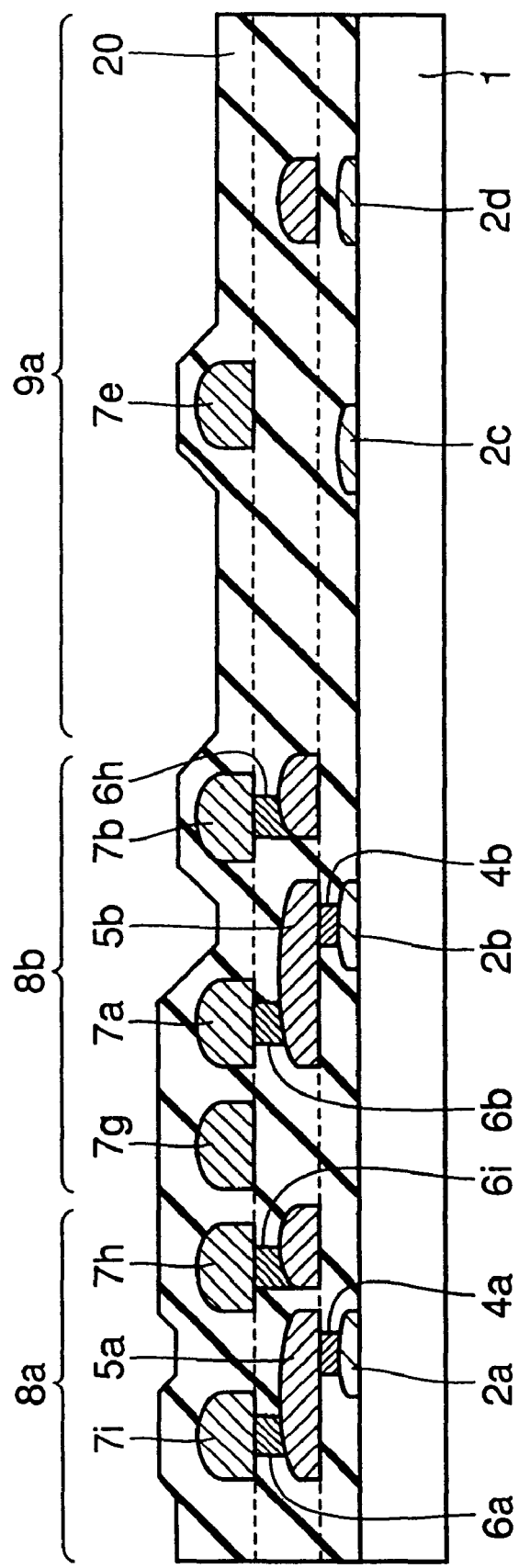
FIG. 2 is a cross sectional view of the structure along the line I—I in FIG. 1.

The first metal interconnections 5*a*, 5*b*, 5*c*, 5*d* and 5*e* and the second metal interconnections 7*a*, 7*b*, 7*c*, 7*d*, 7*e*, 7*f*, 7*g*, 7*h* and 7*i* have a substantially minimum width under a design rule. The space between the first metal interconnections 5*a*, 5*b*, 5*c*, 5*d* and 5*e* and the second metal interconnections 7*a*, 7*b*, 7*c*, 7*d*, 7*e*, 7*f*, 7*g*, 7*h* and 7*i* is the minimum space under the design rule which does not allow another metal interconnection with the minimum width to be formed. The first metal interconnections, the plugs and the second metal interconnections are buried in an inter-layer insulating film 20. The cross sectional structure along the line I—I in FIG. 1 is shown in FIG. 2.

Figure 3:
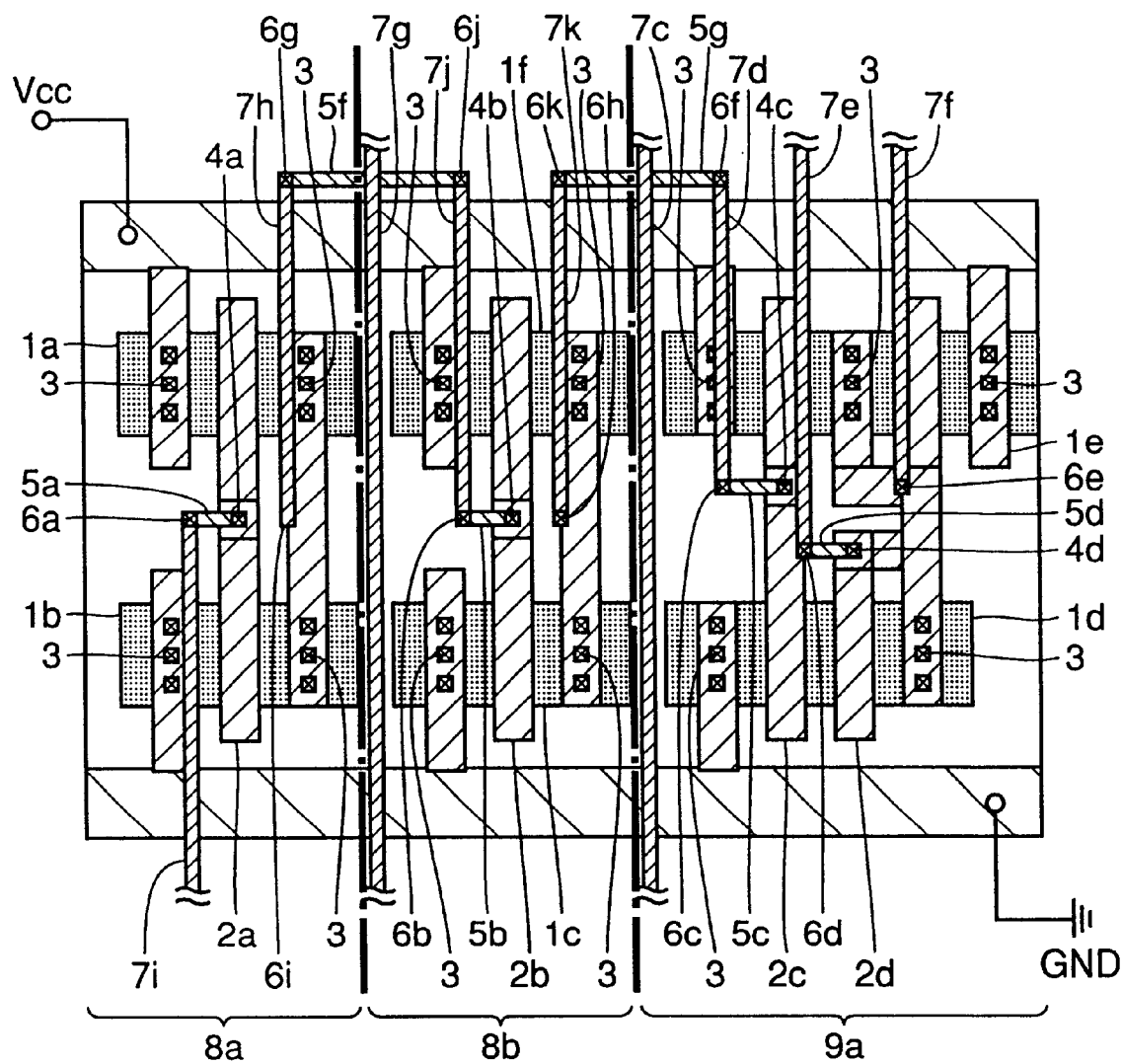
FIG. 3 is a plan view of a structure of the semiconductor device in the first embodiment of the invention in which a spare inverter circuit is used.

A procedure of changing electronic circuit interconnections when spare inverter circuit 8b is used is now described in conjunction with FIG. 3. Inverter circuit 8a, spare inverter circuit 8b and NAND circuit 9a are formed as shown, and an inspection is conducted to decide whether or not the entire electronic circuit is acceptable and thus determine whether or not the logic design of the entire semiconductor device is appropriate. If any mistake is detected in the logic design and a need to use spare inverter circuit 8b arises, a spare mask having a electronic circuit interconnection pattern for making spare inverter circuit 8b available is used to carry out those steps following the steps of forming the first and second metal interconnections.

First, a normal mask is utilized which is planned to be used in the original design, contact plug 4b is formed. Next, the spare mask is used to form first metal interconnections 5f and 5g instead of the first metal interconnection 5e in the pattern of the first metal interconnections shown in FIG. 1. In the following step of forming plugs connected to the first metal interconnections, plugs 6j and 6k are additionally formed in the pattern of plugs shown in FIG. 1. Instead of the second metal interconnections 7a and 7b shown in FIG. 1, second metal interconnections 7j and 7k are formed.

According to this manufacturing method, the change in logic design of the electronic circuit to add spare inverter circuit 8b between inverter circuit 8a and NAND circuit 9a can be accomplished by using the spare mask to change only the patterns of the fast metal interconnections, the plugs and the second metal interconnections. Specifically, just the step of forming electronic circuit interconnections 4b, 5b, 6b, 6h, 7a and 7b is changed that connect spare inverter circuit 8b with normal electronic circuit interconnections after the change in the interconnections, and accordingly, the logic design of the semiconductor device can be changed.

In such a structure of the electronic circuit interconnections in the semiconductor device as described above, if change in interconnections becomes necessary so as to use the spare electronic circuit, there is no need to move to another region the arrangement of the normal electronic circuit interconnections, i.e. the first metal interconnections 5a, 5b, 5c and 5d and the second metal interconnections 7c, 7d, 7e, 7f, 7g, 7h and 7i. Consequently, the path formed of the first metal interconnections 5a, 5b, 5c and 5d as well as the path formed of the second metal interconnections 7c, 7d, 7e, 7f, 7g, 7h and 7i as shown in FIG. 1 remain the same compared with those as shown in FIG. 3 established after the interconnections are changed.

Because of this, the length of interconnections does not change except for the electronic circuit interconnections for connecting spare inverter circuit 8b with inverter circuit 8a and NAND circuit 9a. There is thus no remarkable change in length of the electronic circuit interconnections which is caused when the change in interconnections is accompanied by change in arrangement of the normal electronic circuit interconnections. Delay in pulse travel between electronic circuits, due to a significant change in length of the electronic circuit interconnections, is accordingly avoided. Lag of response timing between electronic circuits caused by the delay in pulse between normal electronic circuits does not occur. In the structure of the semiconductor device in this embodiment, when the spare electronic circuit is used, the arrangement of the electronic circuit interconnections does not change to prevent an adverse effect on the entire electronic circuit due to change in interconnections.

There is thus no need to drastically change normal electronic circuit interconnections, i.e. the routes formed of the first metal interconnections 5a, 5b, 5c, 5d and 5e and the second metal interconnections 7a, 7b, 7c, 7d, 7e, 7f, 7g, 7h and 7i. Consequently, in the vicinity of the changed electronic circuit interconnections, the routes formed of the electronic circuit interconnections are not too closely located to each other. The situation as occurred in the conventional art is prevented that interconnections cannot be changed since the electronic circuit interconnections will be too close to each other after the change in the interconnections. The interconnections can thus be changed without considering the density of interconnection routes, so that change in interconnections is easily achieved. The easy change in the interconnections allows spare electronic circuit 8b to be used with ease.

The space where electronic circuit interconnections are formed for using the spare electronic circuit is secured in advance. Therefore, approximately two layers of interconnections, i.e. the first and second metal interconnections are just changed so as to make it available spare inverter circuit 8b which is a spare electronic circuit. Thus, no change occurs in interconnections in a large number of layers. When interconnections are changed, it is unnecessary to prepare a large number of spare masks for changing the interconnections so as to form a pattern after the change in the interconnections. The interconnections can accordingly be changed with a small number of masks. Consequently, the process of forming electronic circuit interconnections can be shortened and the yield of the semiconductor device can be enhanced with a simple correction of the electronic circuit design.

In this embodiment, the region for fabricating contact plug 4b, the first metal interconnections 5f and 5g, plugs 6j and 6k and the second metal interconnections 7j and 7k which are used when spare inverter circuit 8b is used is located only in the vicinity of electrode terminals of spare inverter circuit 8b, so that the interconnection space can be saved.

Further, in this embodiment, when correction is made in changing interconnections, the second metal interconnections 7a and 7b as the spare electronic circuit interconnections are also formed at the normal mask to clarify, when a spare mask for changing interconnections is formed, the region where spare inverter circuit 8b is formed. Accordingly, a mistake can be avoided in design for changing interconnections such as erroneous formation of electronic circuit interconnections in the region of spare inverter 8b.

Figure 4:
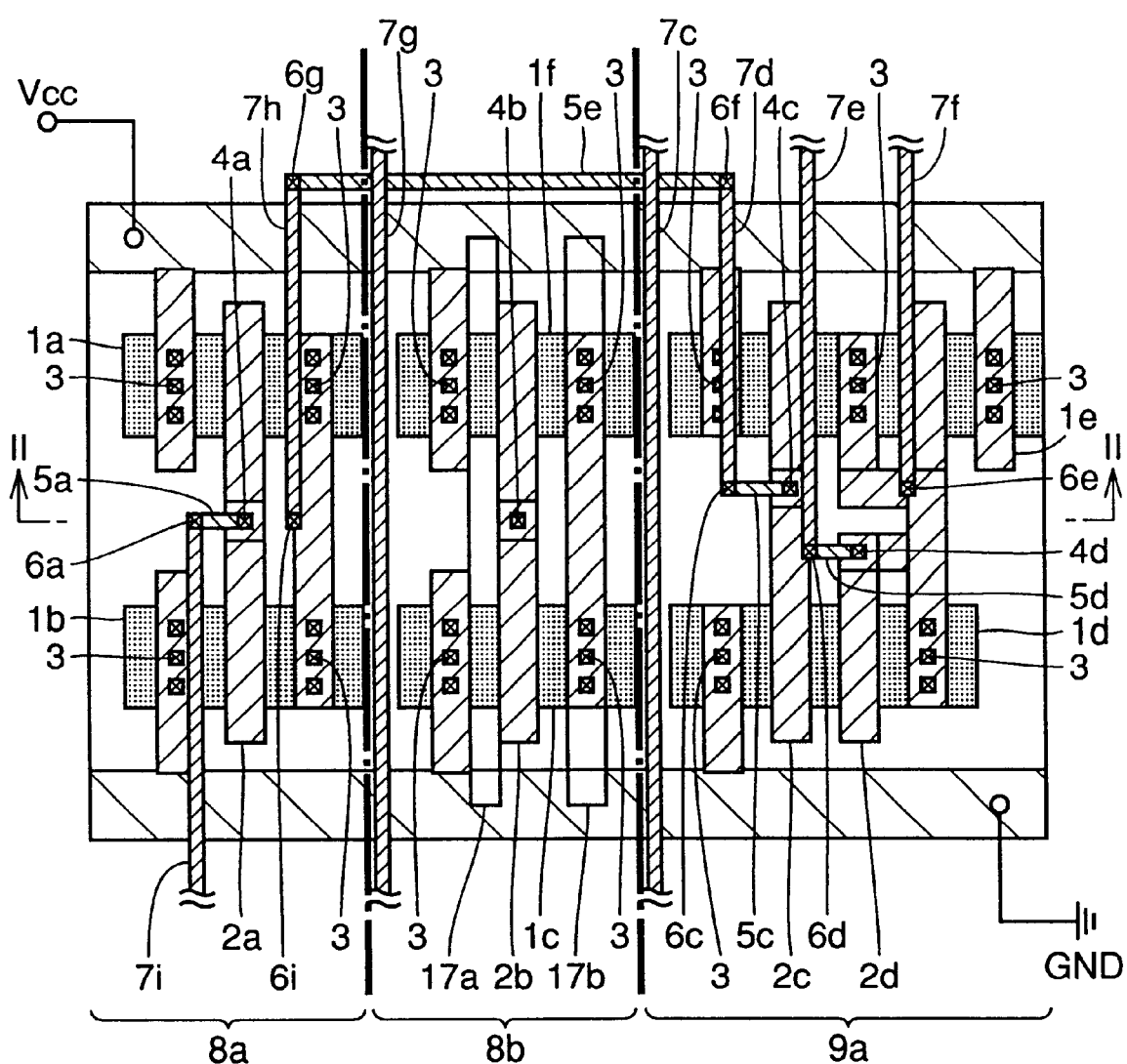
FIG. 4 is a plan view of a structure of the semiconductor device in the first embodiment in which no spare electronic circuit interconnection is provided in a region where the spare inverter circuit is formed.
Figure 5:
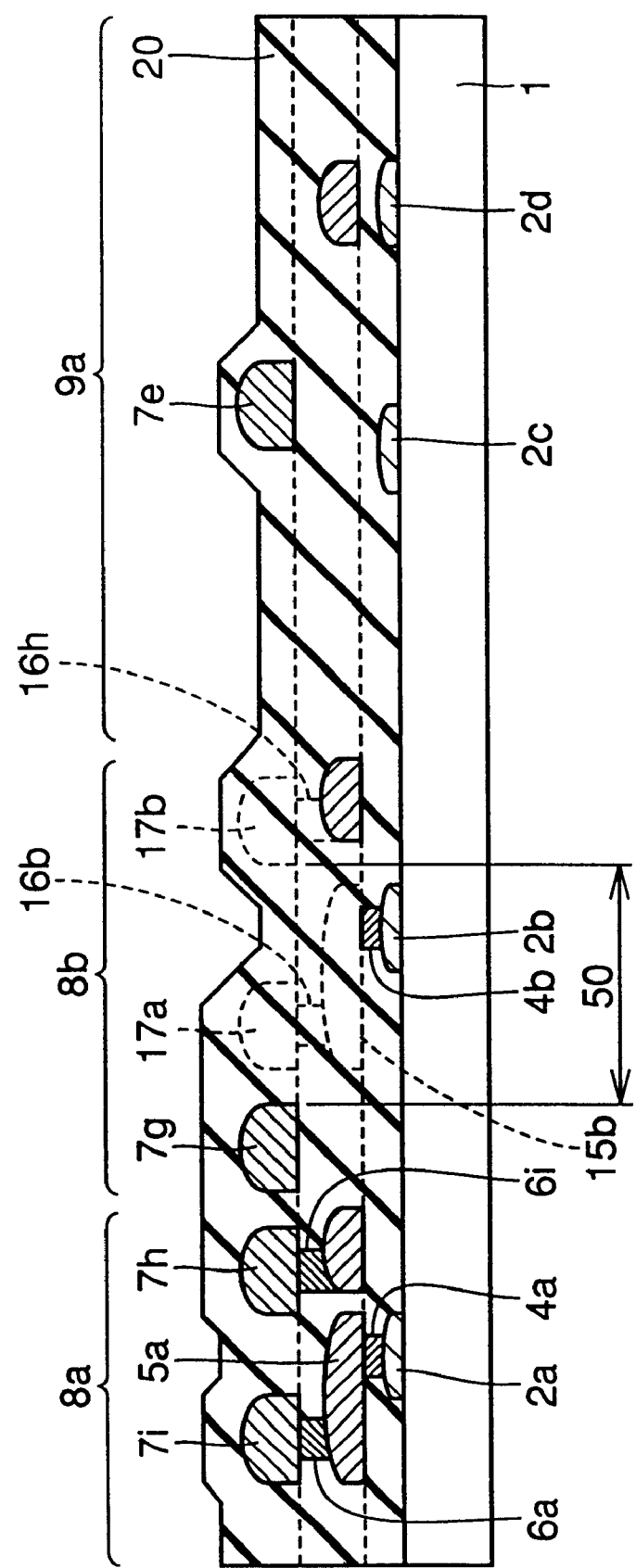
FIG. 5 is a cross sectional view of the structure along the line II—II in FIG. 4.

In the semiconductor device as shown in FIGS. 1 and 2 in this embodiment, even if spare inverter circuit 8b is not used, contact plug 4b, the first metal interconnection 5b, plugs 6b and 6h and the second metal interconnections 7a and 7b are formed. However, without forming the first metal interconnection 5b, plugs 6b and 6h, and the second metal interconnections 7a and 7b, the first metal interconnection 5b, plugs 6b and 6h and the second metal interconnections 7a and 7b as shown in FIGS. 1 and 2 can be formed as shown in FIGS. 4 and 5 by securing spare paths of the first metal interconnection 15b, plugs 16b and 16h and the second metal interconnections 17a and 17b in a region 50 located near the electrode terminals of spare inverter circuit 8b.

Second Embodiment

Figure 6:
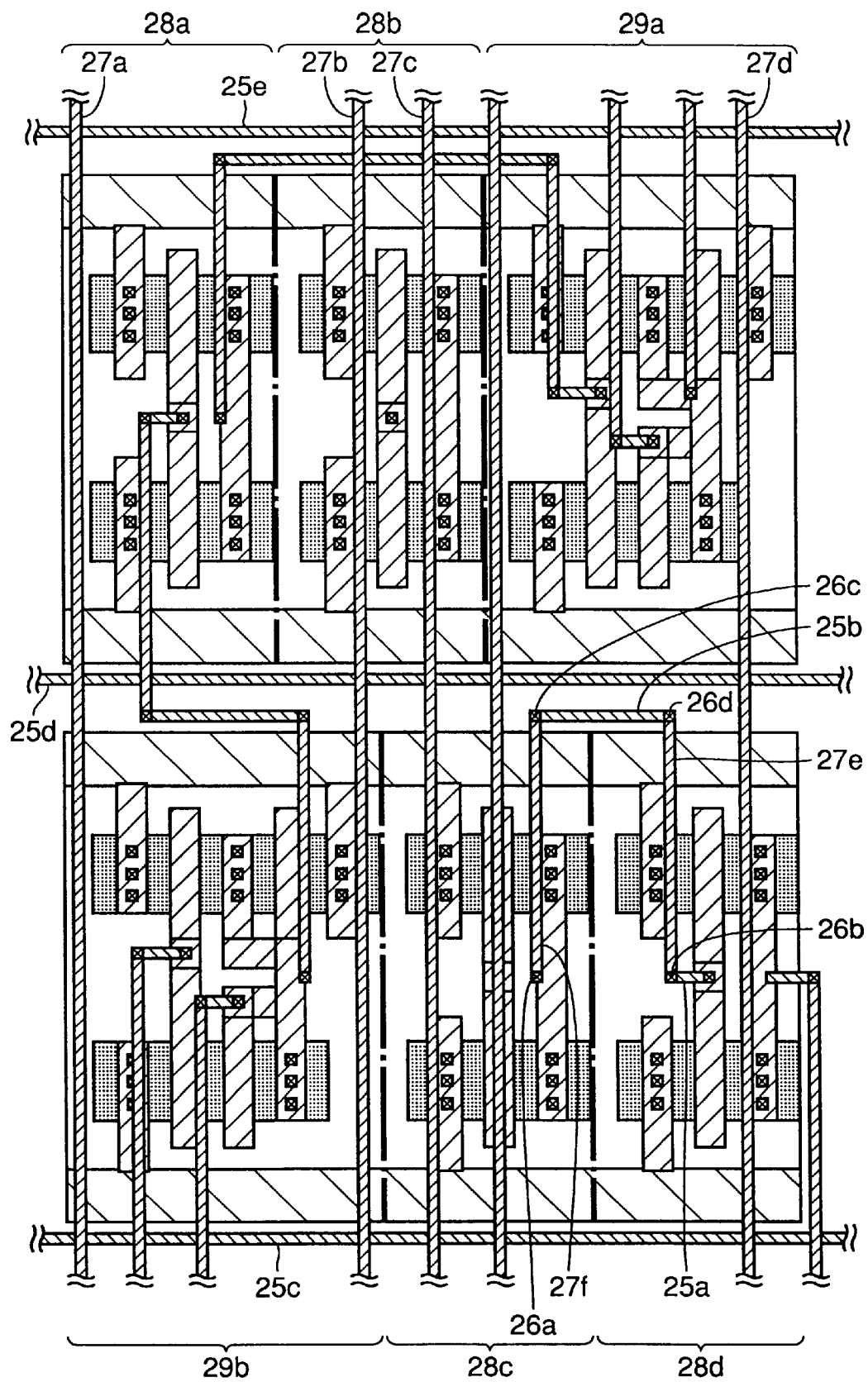
FIG. 6 is a plan view of a structure of a semiconductor device in a second embodiment of the invention having spare electronic circuit interconnections formed as a lattice in which no spare electronic circuit is used.

A semiconductor device in the second embodiment of the invention is now described in conjunction with FIGS. 6 to 9. Referring to FIG. 6, the semiconductor device having a spare electronic circuit in this embodiment includes normal inverter circuits 28a, 28c and 28d having a similar structure to that of inverter circuit 8a in the first embodiment. NAND circuits 29a and 29b having a similar structure to that of NAND circuit 9a in the first embodiment are also provided Between inverter circuits 28a and NAND circuit 29a, a spare inverter circuit 28b having a similar structure to that of spare inverter circuit 8b in the first embodiment is provided which is additionally connected between inverter circuits 28c and 28d in use. As done in the first embodiment, contact plugs are connected to source/drain regions and gate electrodes of these electronic circuits.

In the semiconductor device of this embodiment, in addition to normal first metal interconnections, first metal interconnections 25c, 25d and 25e are provided as spare interconnections. Further, in addition to normal second metal interconnections, second metal interconnections 27a, 27b, 27c and 27d are provided for using spare inverter circuit 28b.

As the first embodiment, the first and second interconnections have a substantially minimum width under a design rule. The space between respective first and second metal interconnections is also the minimum space under the design rule that does not allow another metal interconnection with the minimum width to be formed, as the first embodiment.

Figure 7:
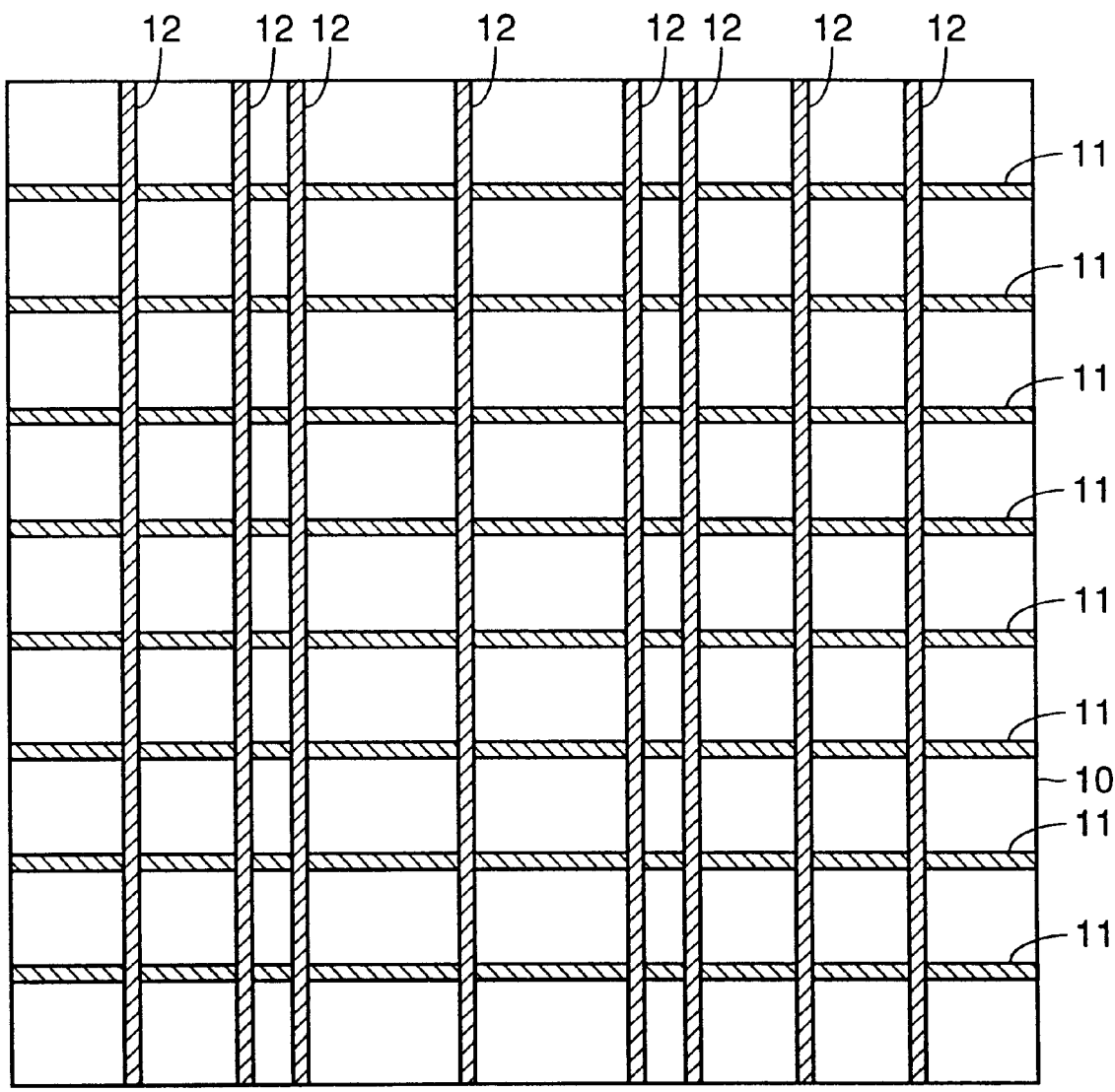
FIG. 7 is a plan view of an entire structure of linearly shaped spare electronic circuit interconnections in the semiconductor device in the second embodiment of the invention.

The total image of formation of the spare electronic circuit interconnections is as shown in FIG. 7. In the plan view of an entire region of a semiconductor chip 10, first metal interconnections 11 and second metal interconnections 12 cross each other substantially perpendicularly. In the three dimensional space, the first and second interconnections 11 and 12 do not cross each other (skew lines).

A procedure of changing circuit interconnections for using spare inverter circuit 28b is described next in conjunction with FIG. 8. A difference between the structures of FIGS. 6 and 8 will be described below. In the process of connecting inverter circuit 28c and spare inverter circuit 28b, the second metal interconnection 27b shown in FIG. 6 is first divided into second metal interconnections 27l, 27m and 27g. Next, a first metal interconnection 25j and plugs 26h and 26i are added and the first metal interconnection 25b shown in FIG. 6 is removed.

In the process of connecting inverter circuit 28d and spare inverter circuit 28b, the second metal interconnection 27c shown in FIG. 6 is divided into second metal interconnections 27k, 27j and 27h. The first metal interconnection 25d shown in FIG. 6 is divided into first metal interconnections 25f, 25g and 25i and plugs 26e and 26f connected to the first metal interconnection 25g is added.

Figure 8:
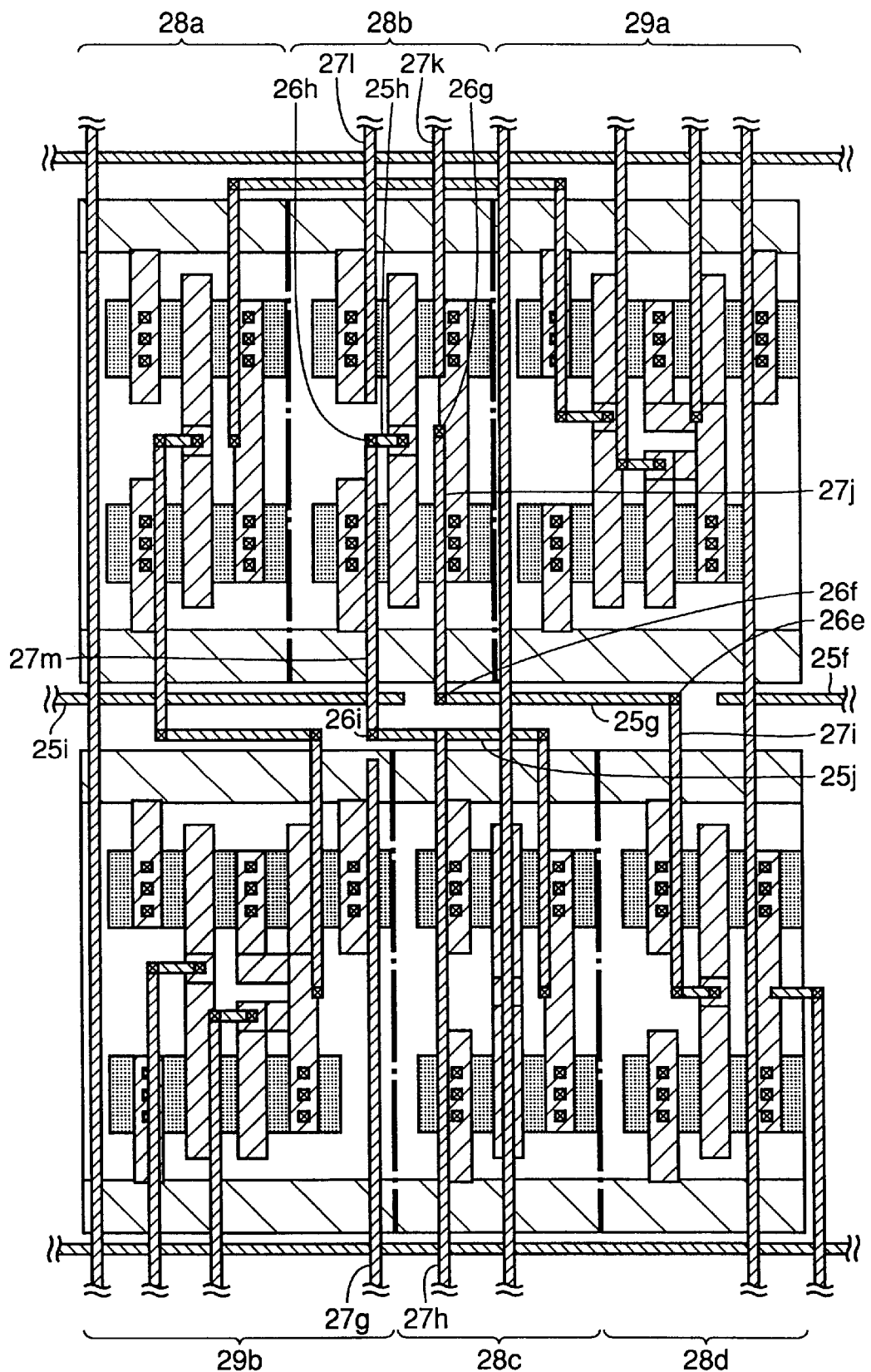
FIG. 8 is a plan view of a structure of the semiconductor device having the lattice-like spare interconnections in the second embodiment of the invention in which a spare electronic circuit is used.

In this embodiment, the first metal interconnections, the plugs and the second metal interconnections are formed by successively using, instead of normal masks, spare masks for the first metal interconnections, the plugs and the second metal interconnections which will generate the structure as shown in FIG. 8.

In this embodiment, the first metal interconnections 25c, 25d and 25e and the second metal interconnections 27b and 27c which are linearly shaped as spare conductive layers are fabricated over the entire semiconductor chip from end to end. Therefore, without changing the arrangement of other normal electronic circuit interconnections, just the first and second metal interconnections are partially changed in the same location so as to establish connection between inverter circuits 28c and 28d as normal electronic circuits and spare inverter circuit 28b as a spare electronic circuit which are located remotely from each other.

In the semiconductor device in this embodiment as described above, spare electronic circuit interconnections which are linear in shape are formed. In the vicinity of a spare electronic circuit such as spare inverter circuit 28b, there is a high possibility that the first metal interconnections 25d and 25e and the second metal interconnections 27a and 27b employed for using spare inverter circuit 28b pass through that region. Accordingly, spare electronic circuits which are dispersed over the entire semiconductor chip such as spare inverter circuit 28b can readily be used.

Since the first and second spare metal interconnections are linearly shaped as the first and second normal metal interconnections, the spare interconnections hardly interrupt the first and second normal metal interconnections.

Figure 9:
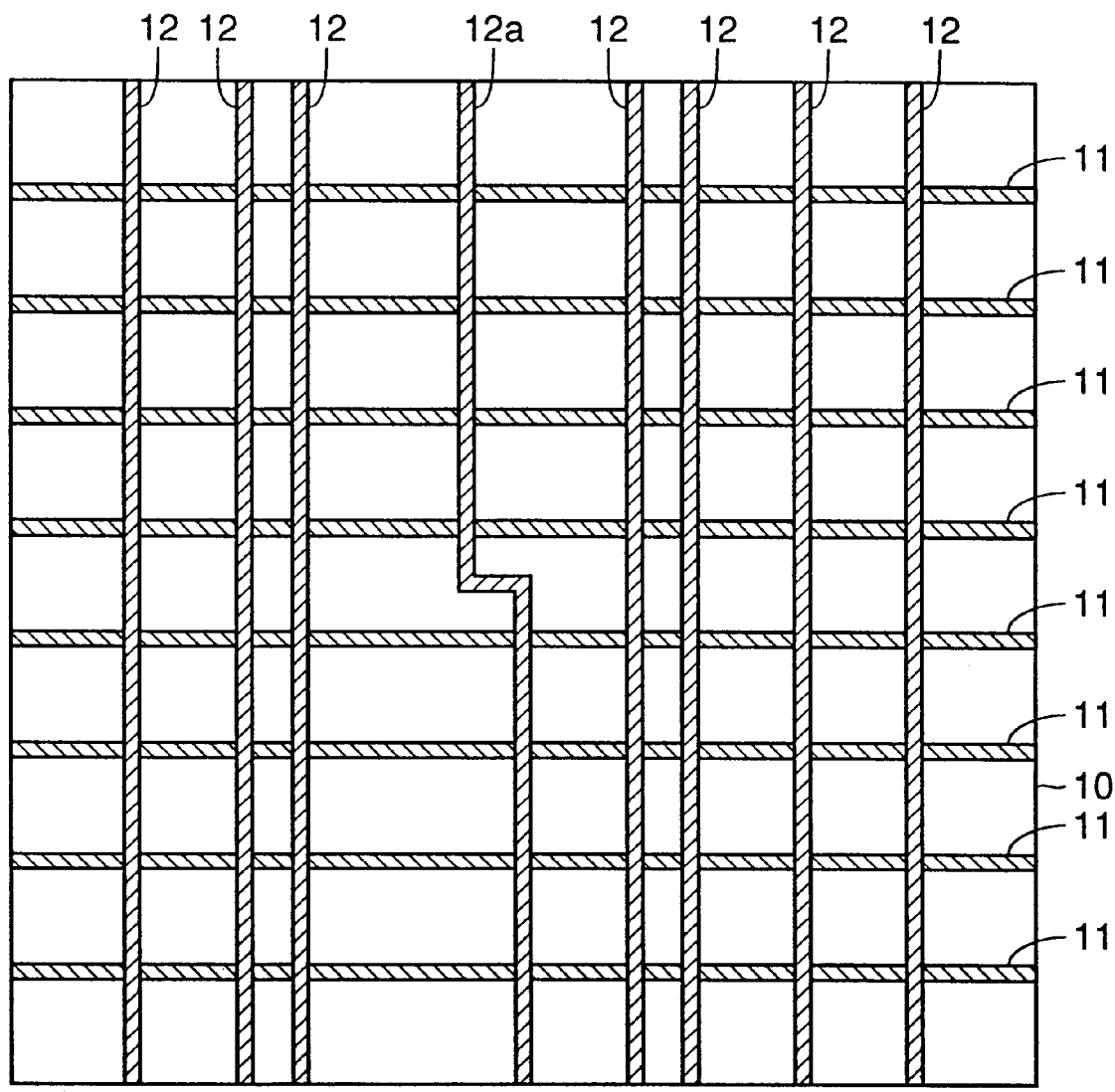
FIG. 9 is a plan view of a structure of the semiconductor device having the lattice-like spare electronic circuit interconnections in which the spare interconnection is partially bent.

In this embodiment, the semiconductor device is shown having the structure where completely linear first and second metal interconnections 11 and 12 are formed as shown in FIG. 7. However, the semiconductor device may have a structure where a second spare metal interconnection 12a is formed which is partially bent as shown in FIG. 9.

Third Embodiment

Figure 10:
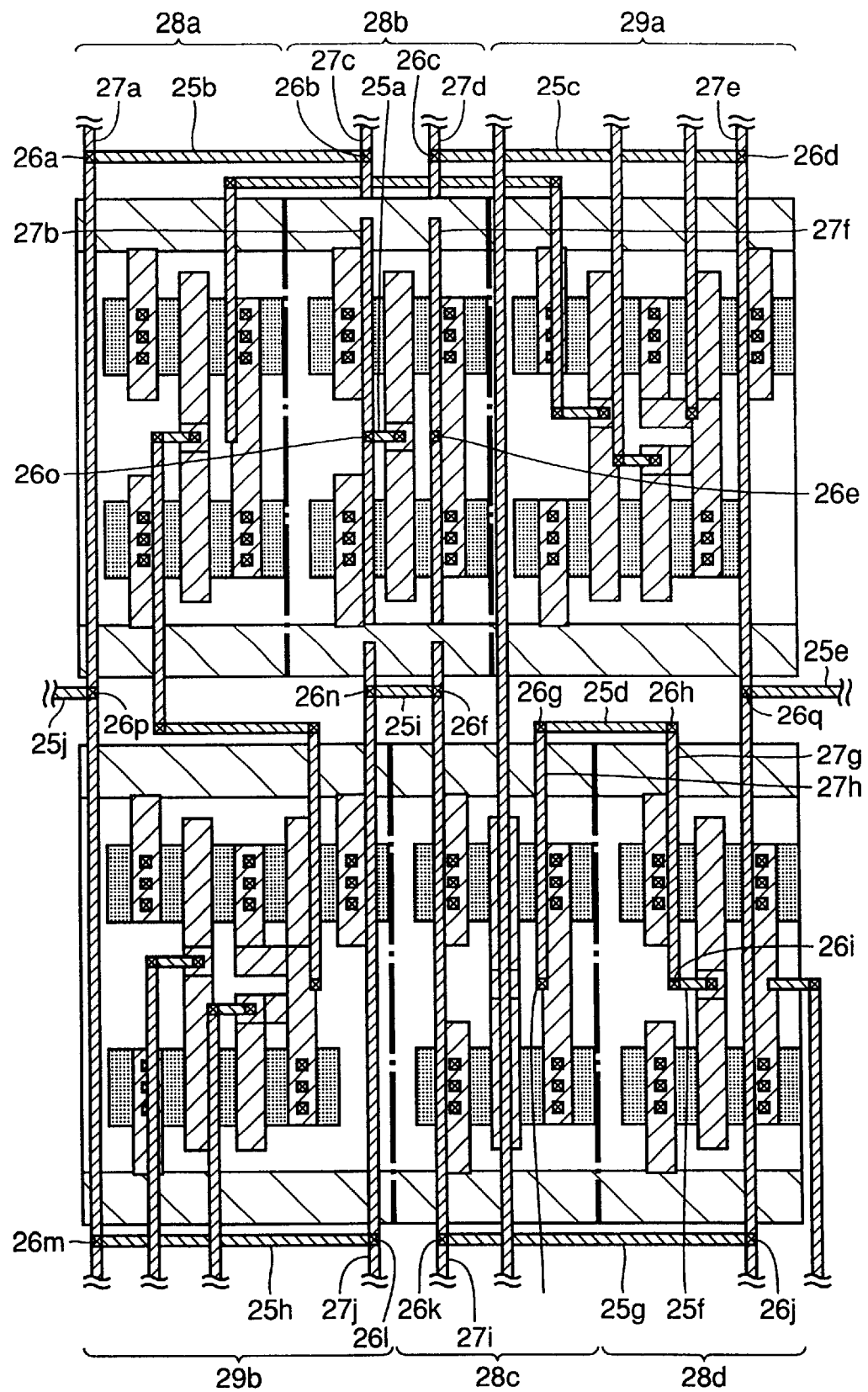
FIG. 10 is a plan view of a structure of a semiconductor device in a third embodiment of the invention having spare electronic circuit interconnections formed as combined ladders with offset rungs in which no spare electronic circuit is used.
Figure 11:
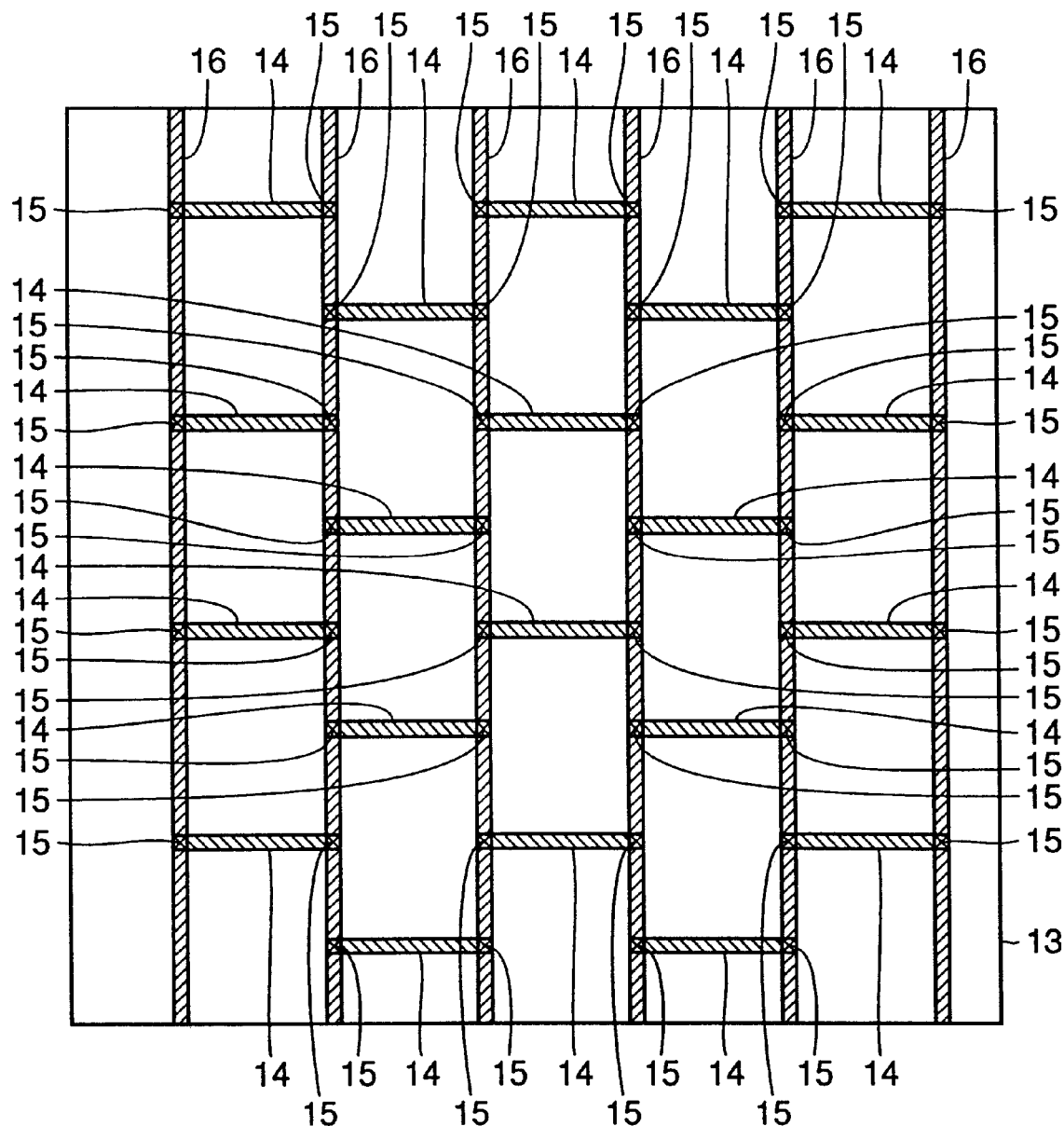
FIG. 11 is a plan view of an entire structure of spare electronic circuit interconnections formed as combined ladders with offset rungs in the semiconductor device in the third embodiment of the invention.
Figure 12:
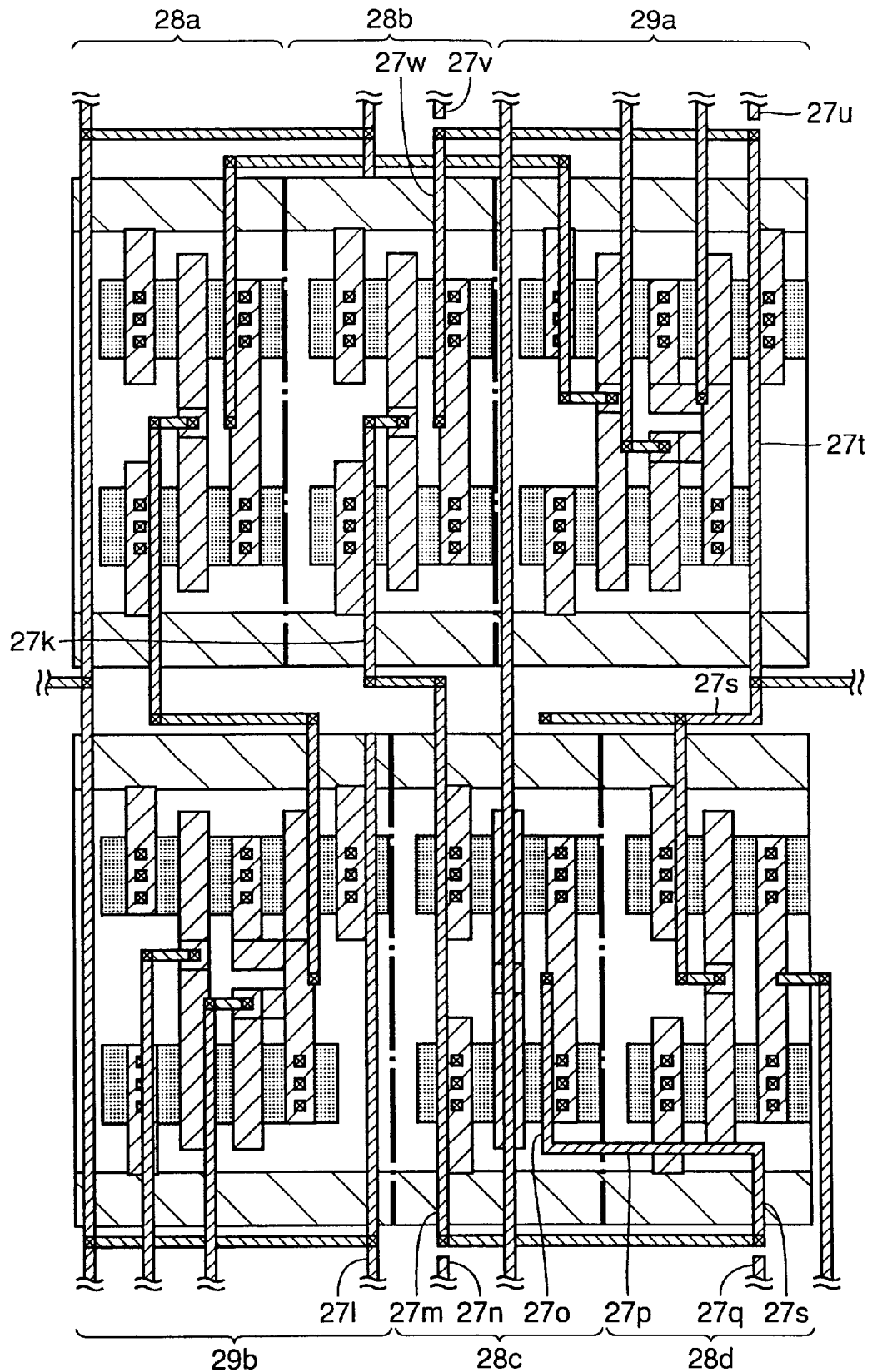
FIG. 12 is a plan view of a structure of the semiconductor device having spare electronic circuit interconnections formed as combined ladders with offset rungs in the third embodiment of the invention in which a spare electronic circuit is used.
Figure 13:
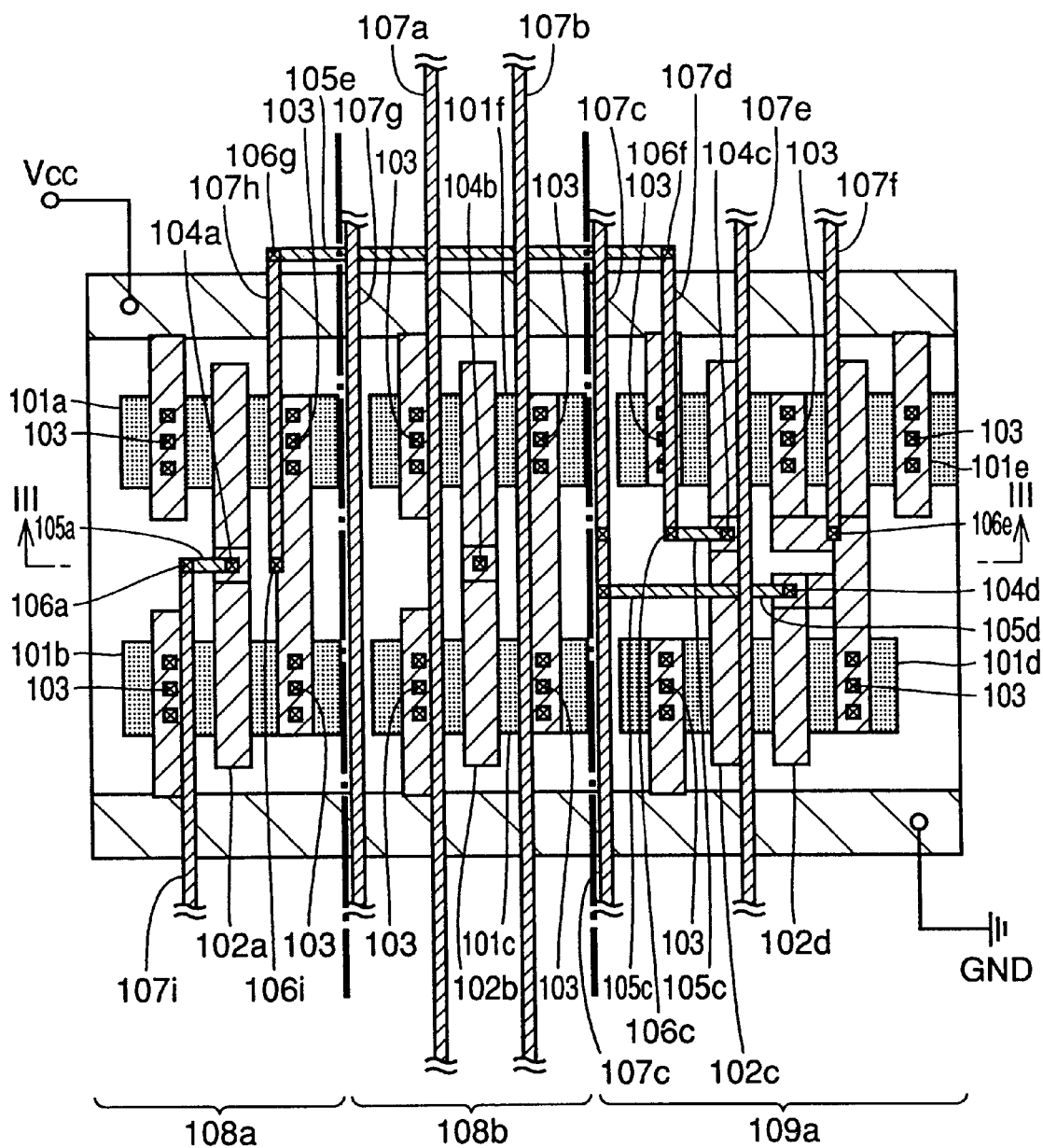
FIG. 13 is a plan view of a structure of a conventional semiconductor device having a spare electronic circuit in which the spare electronic circuit is not used.
Figure 14:
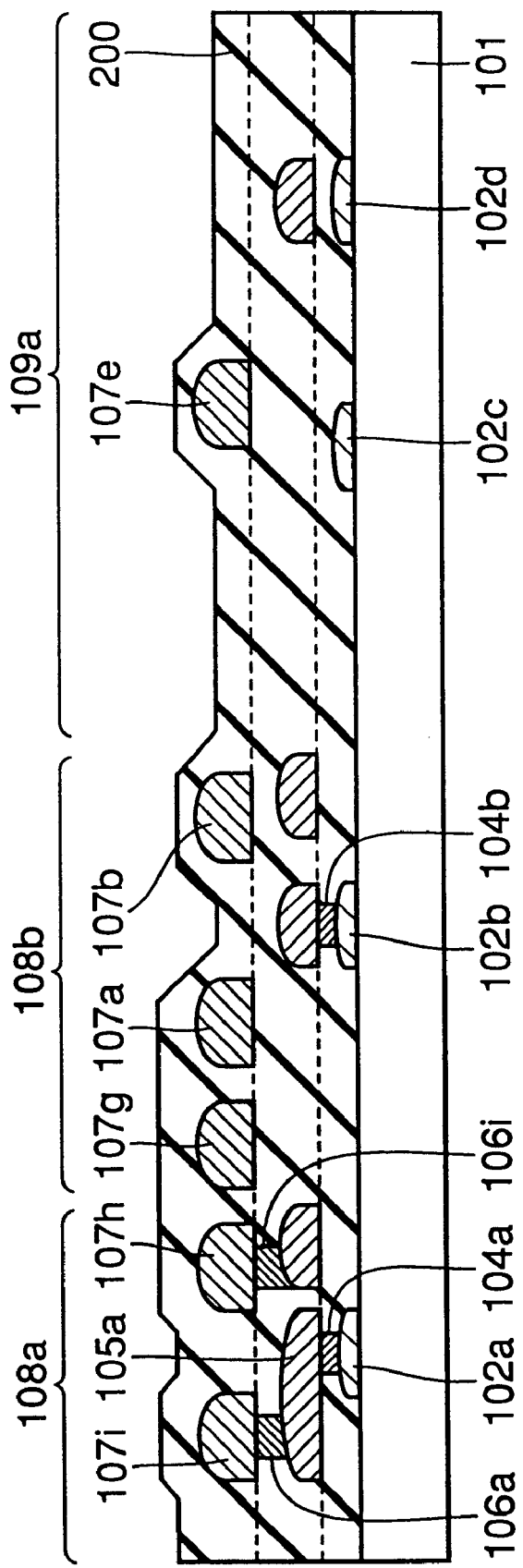
FIG. 14 is a cross sectional view of the structure along the line III—III in FIG. 13.
Figure 15:
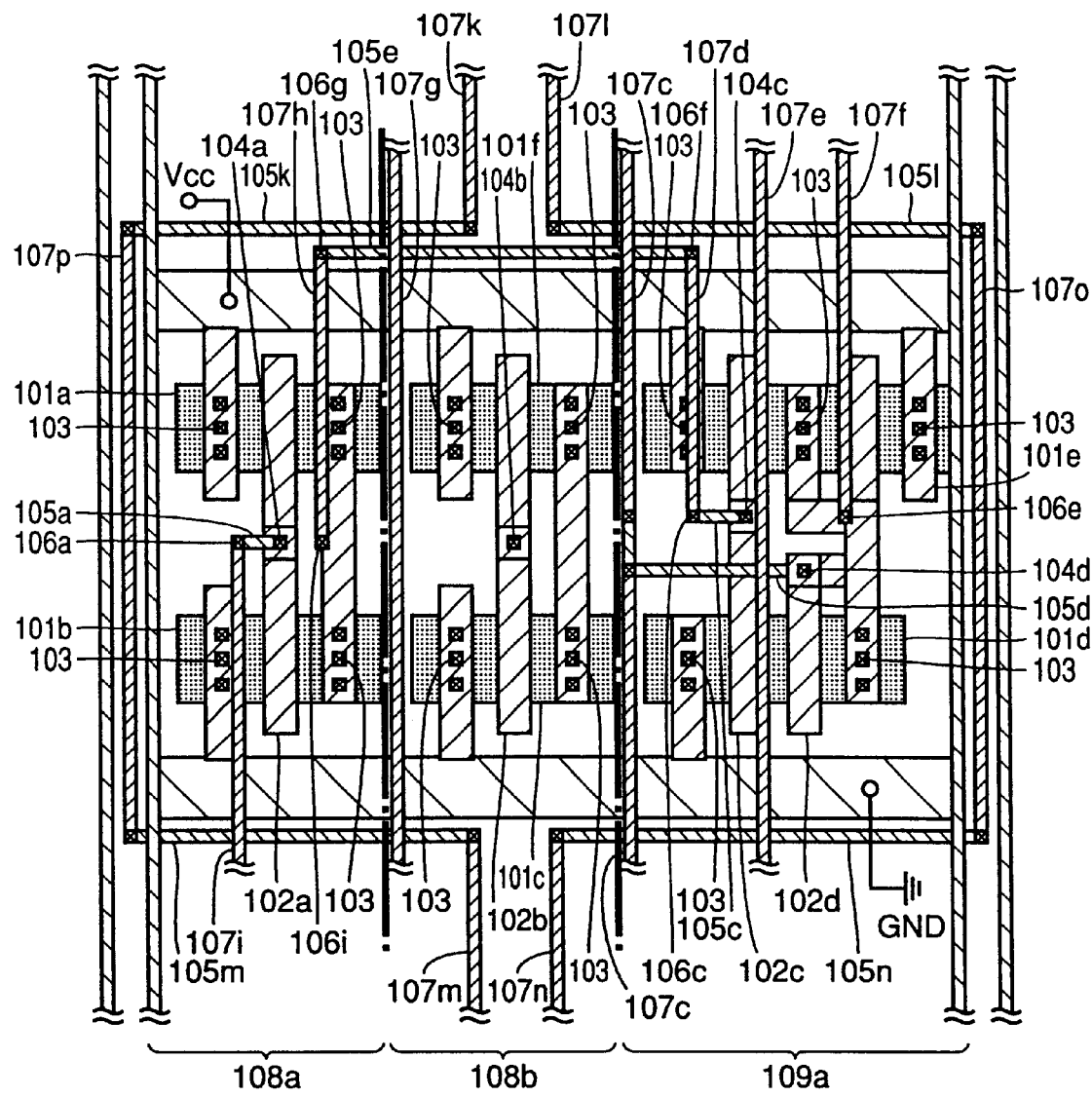
FIG. 15 is a plan view of a structure of the conventional semiconductor device having the spare electronic circuit in which the spare electronic circuit is used.

A semiconductor device in the third embodiment of the invention is now described in conjunction with FIGS. 10 to 12. Referring to FIG. 10, the semiconductor device in this embodiment having a spare electronic circuit includes normal inverter circuits 28a, 28c and 28d and NAND circuits 29a and 29b. Between inverter circuit 28a and NAND circuit 29a, a spare inverter circuit 28b is provided which is connected between inverter circuit 28c and inverter circuit 28d when change in a logic circuit is made.

Inverter circuits 28a, 28c and 28d, spare inverter circuit 28b and NAND circuits 29a and 29b have respective structures which are similar to those of the semiconductor device in the second embodiment.

In the semiconductor device in this embodiment, first metal interconnections 25a, 25b, 25c, 25e, 25g, 25h, 25i and 25j, plugs 26a, 26b, 26c, 26d, 26e, 26f, 26j, 26k, 26l, 26m, 26n, 26o and 26p, and second metal interconnections 27a, 27c, 27d, 27e, 27f, 27i and 27j are placed that are employed when spare inverter circuit 28b is used.

As in the first embodiment, the first and second metal interconnections as listed above have a substantially minimum width under a design rule. Further, the space between respective first and second metal interconnections is a minimum space under the design rule which does not allow another metal interconnection having the minimum width to be formed.

The entire image of the formation of the spare metal interconnections is the one shown in FIG. 11 in which first metal interconnections 14 and second metal interconnections 16 are formed over an entire semiconductor chip 13 as combined ladders with offset rungs in plan view. The first and second metal interconnections 14 and 16 are connected by a plug 15.

A procedure of changing electronic circuit interconnections for using spare inverter circuit 28b as a spare circuit is described below in conjunction with FIG. 12. A structure of the semiconductor device using inverter circuit 28b shown in FIG. 12 is described first. Inverter circuits 28c and 28d and spare inverter circuit 28b are connected by forming a second metal interconnection 27k instead of the second metal interconnection 27b. Instead of the second metal interconnection 27f, a second metal interconnection 27w is formed. The second metal interconnection 27d is cut to produce a second metal interconnection 27v. The second metal interconnection 27e is cut to produce second metal interconnections 27t, 27u, 27s and 27q. The second metal interconnections 27i and 27j are cut to produce second metal interconnections 27m, 27n and 27l. The second metal interconnection 27h is removed.

At this time, no change is made to the plugs connecting the first and second metal interconnections and to the first metal interconnections 25a, 25b, 25c, 25d, 25e, 25f, 25g, 25h, 25i and 25j.

The structure of the semiconductor device in this embodiment is considerably different from that in the above second embodiment shown in FIG. 7. In the structure of the second embodiment, as spare interconnections employed when the spare circuit is used, the first and second metal interconnections are formed like a lattice in plan view without connecting them by plugs. In the structure of the third embodiment, plugs are formed to connect the first and second metal interconnections, and no extra first metal interconnection is formed. Therefore, when the interconnections are changed, the number of portions where spare electronic circuit interconnections are cut is smaller. Accordingly, change in the interconnections for using spare inverter circuit 28b is achieved just by a simple change in interconnections, specifically by change in only the mask for forming the second metal interconnections. Further, like the structure of the semiconductor device in the second embodiment, spare inverter circuit 28b and normal inverter circuits 28c and 28d connected to spare inverter circuit 28b can be connected with a relatively short distance therebetween. It is noted that the two-layer structure formed of the first and second metal interconnections is employed in the first to third embodiments described above, however, if a semiconductor device has a multi-layer structure of metal interconnections, the interconnections can be changed by utilizing the structure of spare interconnections in the first to the third embodiments above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a plurality of normal electronic circuits formed at a main surface of a semiconductor substrate;

a spare electronic circuit formed at said main surface of said semiconductor substrate; and a normal electronic circuit interconnection for electrically connecting said normal electronic circuits with each other, said normal electronic circuit interconnection including normal conductive layers formed above said main surface of said semiconductor substrate to respectively extend substantially in parallel with a plurality of layers which are substantially in parallel with said main surface and having a substantially minimum limit width under an applied design rule, space between said normal conductive layers being defined so as not to allow another conductive layer to newly be formed under said design rule in almost all regions except for a predetermined region, and a spare path for an electronic circuit interconnection being provided so as to form an electronic circuit interconnection which connects said spare electronic circuit with said normal electronic circuit interconnection without making a change in interconnection which is accompanied by change in arrangement of said normal electronic circuit interconnection under said design rule if change in interconnection becomes necessary in said predetermined region in order to use said spare electronic circuit.

2. The semiconductor device according to claim 1, wherein said spare path for the electronic circuit interconnection is formed only in the vicinity of a region where an electrode terminal of said spare electronic circuit is located.

3. The semiconductor device according to claim 1, wherein a spare electronic circuit interconnection having one end connected to said electrode terminal is provided at said spare path for the electronic circuit interconnection in the vicinity of the region of said electrode terminal.

4. The semiconductor device according to claim 1, wherein said spare path for the electronic circuit interconnection includes:

a portion where a plug is to be formed, said plug portion extending substantially perpendicularly to said main surface of said semiconductor substrate and used for forming a plug when the spare electronic circuit is used; and a portion where a conductive layer is to be formed, said conductive layer portion being in contact with an end of said portion where a plug is to be formed, located in a layer which is substantially in parallel with said main surface of said semiconductor substrate, extending substantially in parallel with said normal conductive layers, and used for forming a conductive layer when the spare electronic circuit is used.

5. The semiconductor device according to claim 4, wherein spare plugs constituting plug are formed at said portion where a plug is to be formed when the spare electronic circuit is used, and spare conductive layers constituting conductive layers are formed at said portion where a conductive layer is to be formed when the spare electronic circuit is used.

6. The semiconductor device according to claim 5, wherein said spare conductive layers are stacked to cross substantially perpendicularly to each other in adjacent layers among said layers substantially in parallel with said main surface of said semiconductor substrate.

7. The semiconductor device according to claim 6, wherein said spare conductive layers are formed as combined ladders with offset rungs in plan view in adjacent layers substantially in parallel with said main surface of said semiconductor substrate.

8. A method of manufacturing a semiconductor device comprising the steps of:

forming a plurality of normal electronic circuits and at least one spare electronic circuit at a main surface of a semiconductor substrate;

forming an insulating film on said semiconductor substrate to cover said normal electronic circuits and said spare electronic circuit;

preparing a normal mask having a normal pattern formed so as to form a normal electronic circuit interconnection electrically connecting said normal electronic circuits with each other and preparing a spare mask having in addition to a pattern substantially similar to said normal pattern a pattern of a spare electronic circuit interconnection for using said spare electronic circuit;

inspecting said normal electronic circuits; and selecting, based on result of said inspection, any of said normal mask or said spare mask so as to form on said insulating film an electronic circuit interconnection connecting said normal electronic circuits with each other or connecting said normal electronic circuits with said spare electronic circuit, said normal pattern defined to ensure a spare path for an electronic circuit interconnection which enables said spare electronic circuit interconnection to be formed without making a change which is accompanied by change in arrangement of the pattern of said normal electronic circuit interconnection under an applied design rule.

* * * * *